(12) United States Patent
Ahmed

(10) Patent No.: US 6,885,253 B2
(45) Date of Patent: Apr. 26, 2005

(54) LOW-POWER PHASE-LOCKED-LOOP AND METHOD USING QUADRATURE PHASE-SIGNALS AT ONE-HALF THE OUTPUT FREQUENCY

(75) Inventor: Rizwan Ahmed, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 48 days.

(21) Appl. No.: 10/452,444

(22) Filed: Jun. 2, 2003

(65) Prior Publication Data

US 2004/0251972 A1 Dec. 16, 2004

(51) Int. Cl.[7] .............................................. H03B 27/00
(52) U.S. Cl. .............................. 331/45; 331/34; 331/76
(58) Field of Search .............................. 331/45, 34, 76, 331/185, 186, 1 A, 57, 10; 327/155–159

(56) References Cited

U.S. PATENT DOCUMENTS

| | | | |
|---|---|---|---|
| 5,576,715 A | * | 11/1996 | Litton et al. ........... 342/357.12 |
| 6,208,875 B1 | * | 3/2001 | Damgaard et al. ........ 455/552.1 |
| 6,329,882 B1 | | 12/2001 | Fayneh et al. ................. 331/10 |
| 6,344,778 B1 | * | 2/2002 | Nakamura et al. ............ 331/34 |
| 2004/0005869 A1 | * | 1/2004 | See et al. .................... 455/102 |

* cited by examiner

*Primary Examiner*—Robert Pascal
*Assistant Examiner*—Joseph Chang
(74) *Attorney, Agent, or Firm*—Schwegman, Lundberg, Woessner & Kluth, P.A.

(57) ABSTRACT

A phase-locked loop includes a voltage-controlled oscillator (VCO) to generate a plurality of quadrature-phase signals at one-half an output frequency in response to bias signals. The VCO also includes a times-two multiplier biased by the bias signals to generate the output frequency from the quadrature-phase signals. The bias signals include a load-element bias signal to concurrently bias load elements of buffer stages of the VCO and substantially identical load elements of the multiplier. The bias signal also include a current-source bias signal to concurrently bias current sources of the buffer stages of the VCO and a substantially identical buffer stage of the multiplier. The VCO operating at one-half the output frequency together with the multiplier may consume less power than the VCO when operating at the output frequency.

22 Claims, 6 Drawing Sheets

LOW-POWER PHASE-LOCKED-LOOP AND METHOD USING QUADRATURE PHASE-SIGNALS AT ONE-HALF THE OUTPUT FREQUENCY

TECHNICAL FIELD

Embodiments of the present invention pertain to phase-locked loops (PLLs), and in particular to phase-locked loops that include voltage-controlled oscillators that may be suitable for wireless communication devices.

BACKGROUND

Phase-locked loops are used in integrated circuit applications, computer and processing systems, as well as in wireless and wireline communications devices. Phase-locked loops may provide a wide variety of functions, including, for example, frequency multiplication, frequency synthesis, pulse synchronization, tone decoding, and amplitude and frequency modulation and demodulation. Lower power consumption is always desirable in many of these devices, especially battery-powered devices such as portable computers and wireless communication devices, including third-generation wireless telephones that use low-power chips. In many cases, some functions on these devices, such as baseband processing functions, may go into a low-power or sleep mode to help conserve power when their function is not required. A phase-locked loop, however, is generally kept operational to allow a fast wake-up and may continue to draw power even when many other device functions are in sleep mode.

Thus there are general needs for phase-locked loops and methods of providing an output frequency.

BRIEF DESCRIPTION OF THE DRAWINGS

The appended claims are directed to some of the various embodiments of the present invention. However, the detailed description presents a more complete understanding of embodiments of the present invention when considered in connection with the figures, wherein like reference numbers refer to similar items throughout the figures and:

DETAILED DESCRIPTION

The following description and the drawings illustrate specific embodiments of the invention sufficiently to enable those skilled in the art to practice them. Other embodiments may incorporate structural, logical, electrical, process, and other changes. Examples merely typify possible variations. Individual components and functions are optional unless explicitly required, and the sequence of operations may vary. Portions and features of some embodiments may be included in or substituted for those of others. The scope of embodiments of the invention encompasses the full ambit of the claims and all available equivalents of those claims.

Figure 1:
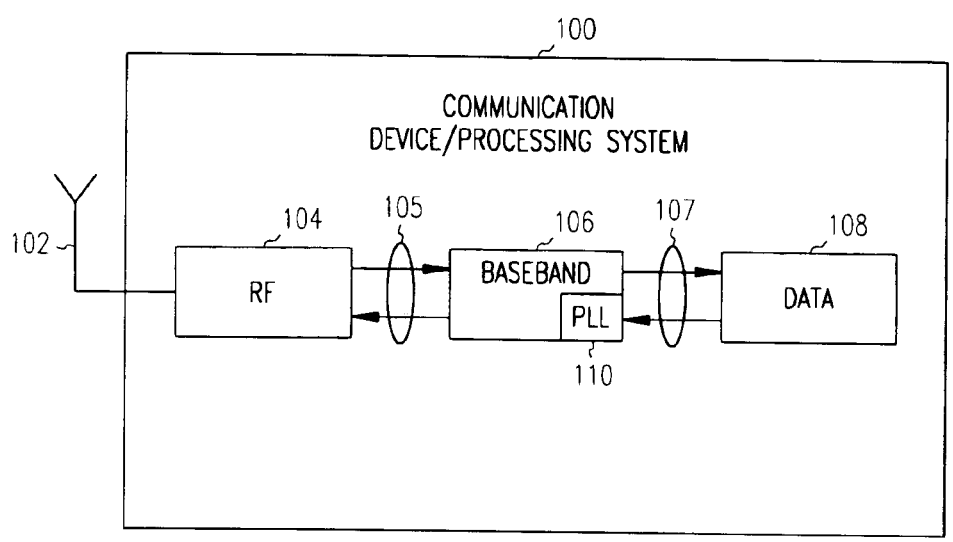
FIG. 1 is a block diagram of a communication device in accordance with embodiments of the present invention.

FIG. 1 is a block diagram of a communication device in accordance with embodiments of the present invention. Communication device 100 receives and/or transmits radio frequency (RF) communications with antenna 102. RF signals received from antenna 102 may be down-converted to baseband signals 105 by RF conversion circuit 104. Baseband signals 105 from baseband processor 106 may be up-converted by RF conversion circuit 104 for transmission by antenna 102. Baseband processor 106 may convert baseband signals 105 to data signals 107 for data unit 108 and may convert data signals 107 from data unit 108 to baseband signals 105.

Wireless communication device 100 may be a personal digital assistant (PDA), a laptop or portable computer with wireless communication capability, a web tablet, a wireless telephone, a wireless headset, a pager, an instant messaging device, an MP3 player, a digital camera, an access point or other device that may receive and/or transmit information wirelessly. In embodiments, RF conversion circuit 104 may transmit and/or receive RF communications in accordance with specific communication standards, such as the IEEE 802.11(a), 802.11(b) and/or 802.11(g) standards for wireless local area network standards, although circuit 104 may also be suitable to transmit and/or receive communications in accordance with other techniques including the Digital Video Broadcasting Terrestrial (DVB-T) broadcasting standard, and the High performance radio Local Area Network (HiperLAN) standard. Antenna 102 may comprise a directional or omnidirectional antenna, including, for example, a dipole antenna, a monopole antenna, a loop antenna, a microstrip antenna or other type of antenna suitable for reception and/or transmission of RF signals which may be processed by circuit 104.

Although communication device 100 is illustrated as a wireless communication device, device 100 may be almost any wireless or wireline communication device, including a general purpose processing or computing system. In some embodiments, device 100 may be a battery-powered device. In some of these embodiments, device 100 may not require antenna 102 and may not require RF conversion circuit 104.

In accordance with embodiments of the present invention, baseband processor 106 includes phase-locked loop (PLL) 110 to provide one or more frequencies for in baseband processor 106. In embodiments, phase-locked loop 110 provides frequencies for use by a baseband processor in converting between digital data signals 107 and analog baseband signals 105, although phase-locked loop 110 may have many other uses in such systems.

Phase-locked loop 110 may include a voltage-controlled oscillator (VCO) to generate a plurality of quadrature-phase signals at one-half an output frequency in response to bias signals, and a times-two multiplier biased by the bias signals to generate the output frequency from the quadrature-phase signals. The bias signals may include a load-element bias signal to concurrently bias load elements of buffer stages of the VCO and substantially identical load elements of the multiplier. The bias signal may also include a current-source bias signal to concurrently bias current sources of the buffer stages of the VCO and a substantially identical buffer stage of the multiplier. The current-source bias signal may also provide bias to a current source of a charge pump of phase-locked loop 110. The VCO operating at one-half the output frequency, together with the multiplier, may consume less power than a similar VCO operating at the output frequency.

Although system 100 is illustrated as having several separate functional elements, one or more of the functional elements may be combined and may be implemented by combinations of software-configured elements, such as processing elements including digital signal processors (DSPs), and/or other hardware elements. For example, processing elements may comprise one or more microprocessors, DSPs, application specific integrated circuits (ASICs), and combinations of various hardware and logic circuitry for performing at least the functions described herein.

Figure 2:
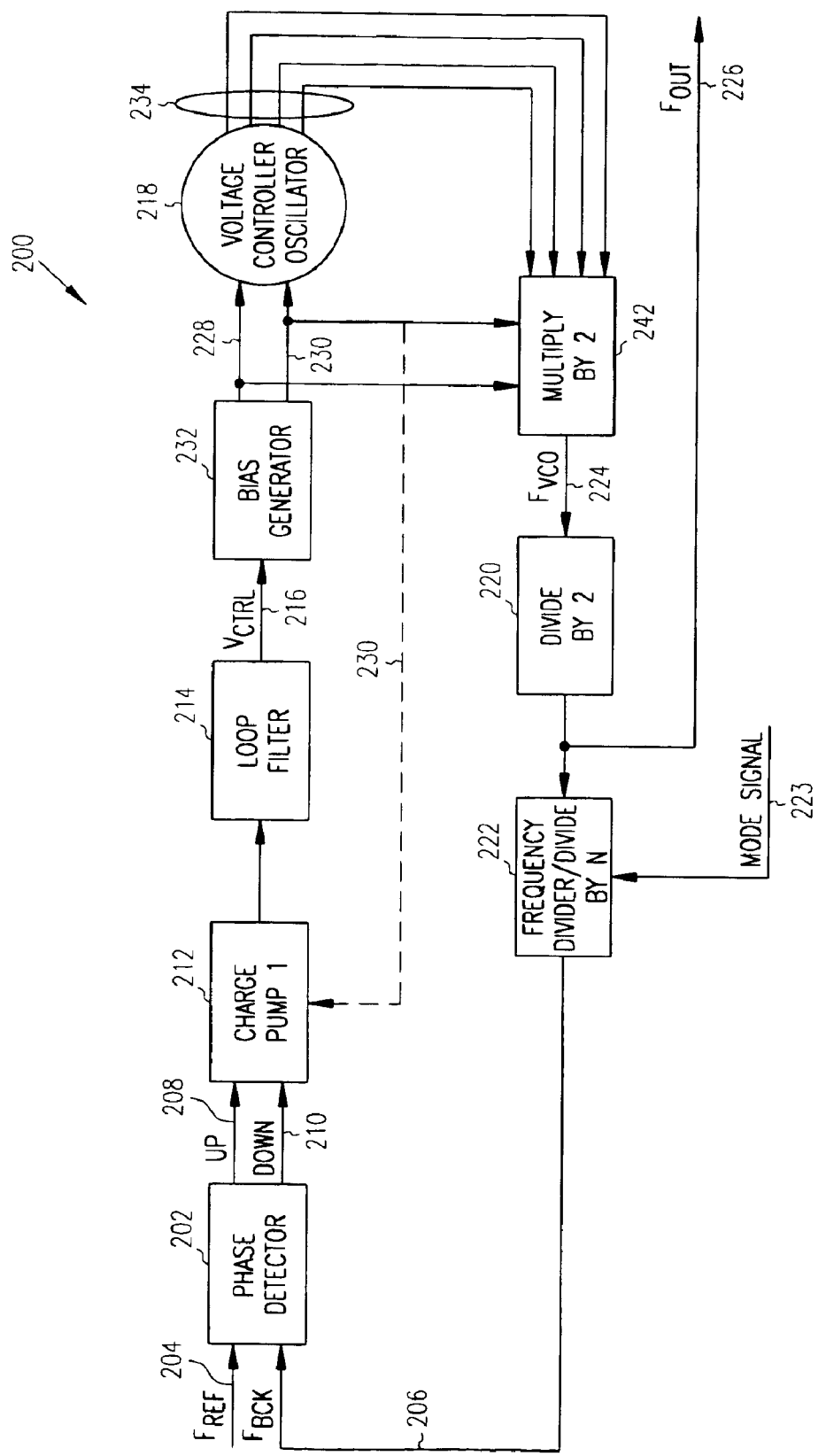
FIG. 2 is a block diagram of a phase-locked loop in accordance with embodiments of the present invention.

FIG. 2 is a block diagram of a phase-locked loop in accordance with embodiments of the present invention. Phase-locked loop (PLL) 200 may be suitable for use as phase-locked loop 110 (FIG. 1) although other phase-locked loops are also suitable. Phase-locked loop 200 may be used for, among other things, frequency synthesis, frequency multiplication, pulse synchronization, tone decoding, and AM and FM modulation and demodulation. Phase-locked loop 200 includes phase detector 202 which detects a phase difference between reference signal 204 and feedback signal 206. Phase detector 202 may control charge pump 212 through signals 208 and 210 to either charge or discharge loop filter 214. Loop filter 214 may integrate the output of charge pump 212 to generate control voltage 216. Signals 208 and 210 may include pulses having a width proportional to a phase difference between signals 204 and 206. Reference signal 204 may be provided to a baseband processor of a baseband processor, such as baseband processor 106 (FIG. 1).

Phase-locked loop 200 also includes bias generator 232, which receives control voltage 216 and generates bias signals 228 and 230. Voltage-controlled oscillator (VCO) 218 receives bias signals 228 and 230 and generates a plurality of output signals 234 which are multiplied in multiplier 242. Bias signal 228 may have a non-linear relation, such as a quadratic relation, to control voltage 216. In embodiments; output signals 234 may be quadrature-phase signals with about a ninety-degree phase difference between adjacent signals. Output signals 234 may also be at about one-half the output frequency, and multiplier 242 may be a times-two multiplier to generate signal 224 at the output frequency. Multiplier 242 also may receive bias signals 228 and 230. In embodiments, bias signal 228 may be a load-element bias voltage to bias load elements of buffer stages of VCO 218 to control the frequency of VCO 218. Bias signal 228 may also bias load elements of multiplier 242. Bias signal 230 may be a current-source bias voltage and may bias current sources of the buffer stages of VCO 218 as well as bias a current source of multiplier 242. In one embodiment, bias signal 230 may bias a current source of charge pump 212.

In some of these embodiments, the load elements of the buffer stages of VCO 218 and the load elements of multiplier 242 may be substantially identical and may be located near each other on a single die. The current sources of the buffer stages of VCO 218 and the current source of multiplier 242 and/or charge pump 212 may be substantially identical and may be located near each other on the die.

Bias generator 232 may comprise an operational amplifier responsive to control signal 216, load elements and a current source. The operational amplifier may be coupled with the current source to generate bias signal 230. Bias signal 228 may be generated by the load element.

In some embodiments, digital logic or a processor, such as the baseband processor of baseband processor 106 (FIG. 1), may be provided an output frequency signal having a 50% duty cycle clock, such as output frequency signal 226. In these embodiments, to generate a 50% duty cycle clock at output frequency signal 226, the frequency of signal 224 may be divided by two by divide-by two element 220. In some embodiments, signal 226 may be further divided by frequency divider 222 to generate feedback signal 206. Signals 208 and 210 may drive, charge pump 212 to set the proper loop-filter control voltage 216 to maintain a small phase error between the signals 204 and 206 applied to phase detector 202.

The initial operation of phase-locked loop 200 may be described as follows. Initially when a system is powered up or when there is no reference signal 204, phase-locked loop 200 may be in an unlocked state. When the system is powered up or when a reference signal is applied to a powered phase-locked loop, the phase-locked loop may go through a phase-lock operation to acquire phase lock. During this process, VCO 218 and multiplier 242 concurrently receive bias signals 228 and 230 from bias generator 232. During the phase acquisition process, VCO 218 and multiplier 242 may track each other in frequency because they are substantially identically biased. Bias signals 228 and 230 may track changes in frequency. For example, when the frequency of output signals 224 is increasing, bias signals 228 and 230 may provide an increasing bias voltage, and when the frequency of output signals 224 is decreasing, bias signals 228 and 230 may provide a decreasing bias voltage. Both VCO 218 and multiplier 242 may track accordingly. If both VCO 218 and multiplier 242 were not provided bias signals 228 and 230 which change with frequency, during lock acquisition, the output frequency of the VCO may exhibit a damped response, and frequency may increase and/or decrease over several decades making it difficult, if not impossible, to achieve phase lock. Accordingly, the concurrent biasing of VCO 218 and multiplier 242 helps ensure a guaranteed phase lock for phase-locked loop 200.

In embodiments in which phase-locked loop 200 is part of a wireless communication device, frequency divider 222 may be responsive to mode signal 223, which may be provided by a baseband processor, such as a baseband processor in baseband processor 106 (FIG. 1). In this embodiment, frequency divider may divide signal 226 by a number indicated by mode signal 223.

Although phase-locked loop 200 is illustrated as having several separate functional elements, one or more of the functional elements may be combined and may be implemented by combinations of software and/or hardware configured elements.

Figure 3:
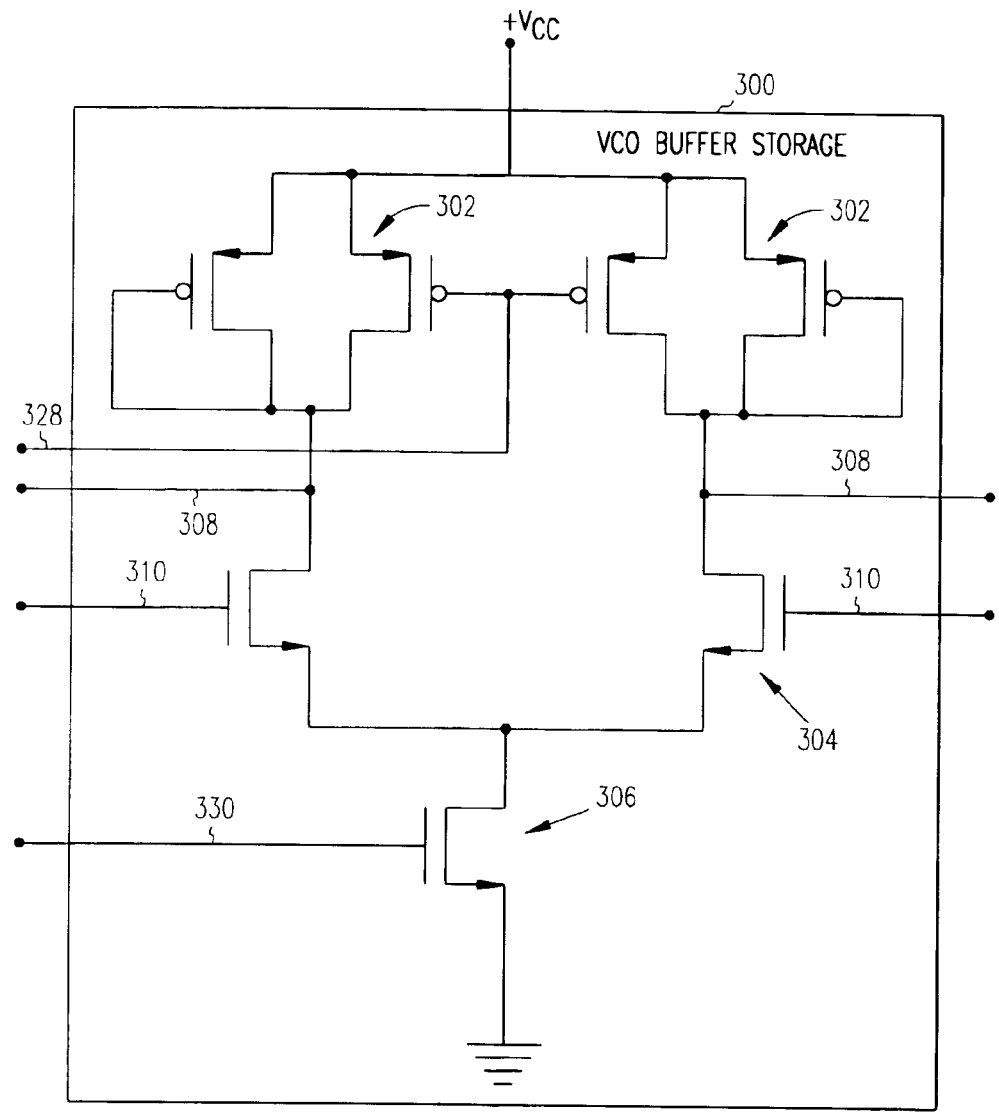
FIG. 3 is a circuit diagram of a voltage-controlled oscillator (VCO) buffer stage in accordance with embodiments of the present invention.

FIG. 3 is a circuit diagram of a voltage-controlled oscillator (VCO) buffer stage in accordance with embodiments of the present invention. Buffer stage 300 may be suitable for use as one of a plurality of buffer stages that may comprise a VCO, such as VCO 218 (FIG. 2). In one embodiment, VCO 218 (FIG. 2) may comprise a ring-oscillator in which the buffer stages may be arranged in a ring configuration. Buffer stage 300 may include load elements 302 biased in accordance with load-element bias signal 328, source-coupled differential pair 304, and current source 306 for source-coupled differential pair 304. Current source 306 may be biased by current-source bias signal 330. Load-element bias signal 328 may be provided by bias generator 232 (FIG. 2) and may correspond to bias signal 228 (FIG. 2). Current-source bias signal 330 may also be provided by bias generator 232 (FIG. 2) and may correspond to bias signal 230 (FIG. 2). In embodiments, load elements 302 may be PMOS (P-channel metal-oxide semiconductor) load elements having PMOS transistors, and current source 306 may be an NMOS (N-channel metal-oxide semiconductor) current source comprising an NMOS transistor.

Buffer stages 300 may have one or more outputs 308, which may correspond to one of VCO outputs 234 (FIG. 2) to provide one or more of the quadrature signals. Buffer stage 300 may also have inputs 310 which may be coupled to the outputs of another buffer stage of the plurality of buffer stages to form the ring oscillator. In embodiments, four buffer stages 300 may be used to form a ring, although other numbers of buffer stages may also be used.

Figure 4:
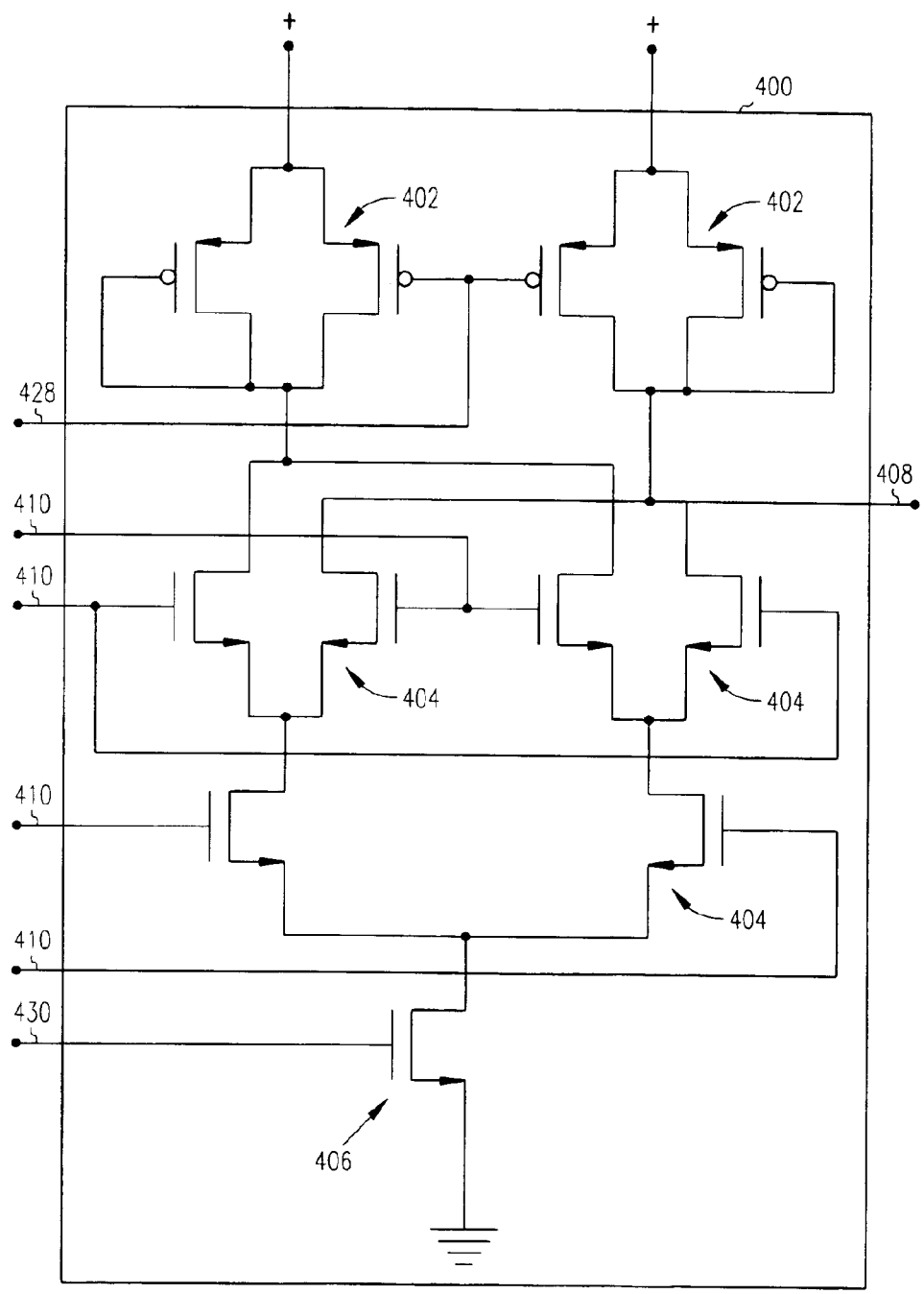
FIG. 4 is a circuit diagram of a multiplier in accordance with embodiments of the present invention.

FIG. 4 is a circuit diagram of a multiplier in accordance with embodiments of the present invention. Multiplier 400 may be suitable for use as multiplier 242 (FIG. 2) although other multipliers may also be suitable. Multiplier 400 is a times-two multiplier that may multiply the frequency of input signals 410 by two to generate output signal 408 of twice the input frequency. Multiplier 400 may include load elements 402 biased in accordance with load-element bias signal 428, source-coupled differential pairs 404, and current source 406 for source-coupled differential pairs 404. Current source 406 may be biased by current-source bias signal 430. Load-element bias signal 428 may be provided by bias generator 232 (FIG. 2) and may correspond to bias signal 228 (FIG. 2). Current-source bias signal 430 may also be provided by bias generator 232 (FIG. 2) and may correspond to bias signal 230 (FIG. 2). In embodiments, load elements 402 may be PMOS load elements having PMOS transistors, and current source 406 may be an NMOS current source comprising an NMOS transistor. In operation, multiplier 400 may receive quadrature signals, such as signals 234 (FIG. 2), at inputs 410 and may generate an output frequency signal at twice the frequency of the quadrature signals at output 408.

An advantage of these embodiments is that the oscillation frequency of VCO 218 (FIG. 2) is half the frequency of an oscillation frequency of a VCO of a conventional PLL. Since the oscillation frequency may be directly proportional to the root of the buffer bias current in complimentary metal-oxide semiconductor (CMOS) based VCOs, a substantial bias current savings and decrease in the overall power dissipation of PLL 200 (FIG. 2) may be achieved. This decrease in VCO bias current may be achieved while maintaining a given reference frequency and VCO output frequency as compared with conventional PLLs, which would operate at twice the frequency.

In one example embodiment, PLL 200 (FIG. 2) may be part of a wireless communication device, such as a GSM (Global System for Mobile) wireless communication device. In this example embodiment, reference frequency 204 (FIG. 2) may be about 13 MHz and the VCO output frequency of signals 224 (FIG. 2) may be about 130 MHZ. Convention PLLs, on the other hand, may provide VCO output frequency of about 260 MHZ. Frequency divider 222 may divide the frequency of signal 226 by N, which may be a number around 20. By operating VCO 218 at half of oscillation frequency of a conventional VCO, significant power savings may be achieved. In the case of battery-powered devices, battery time may be extended.

Figure 5:
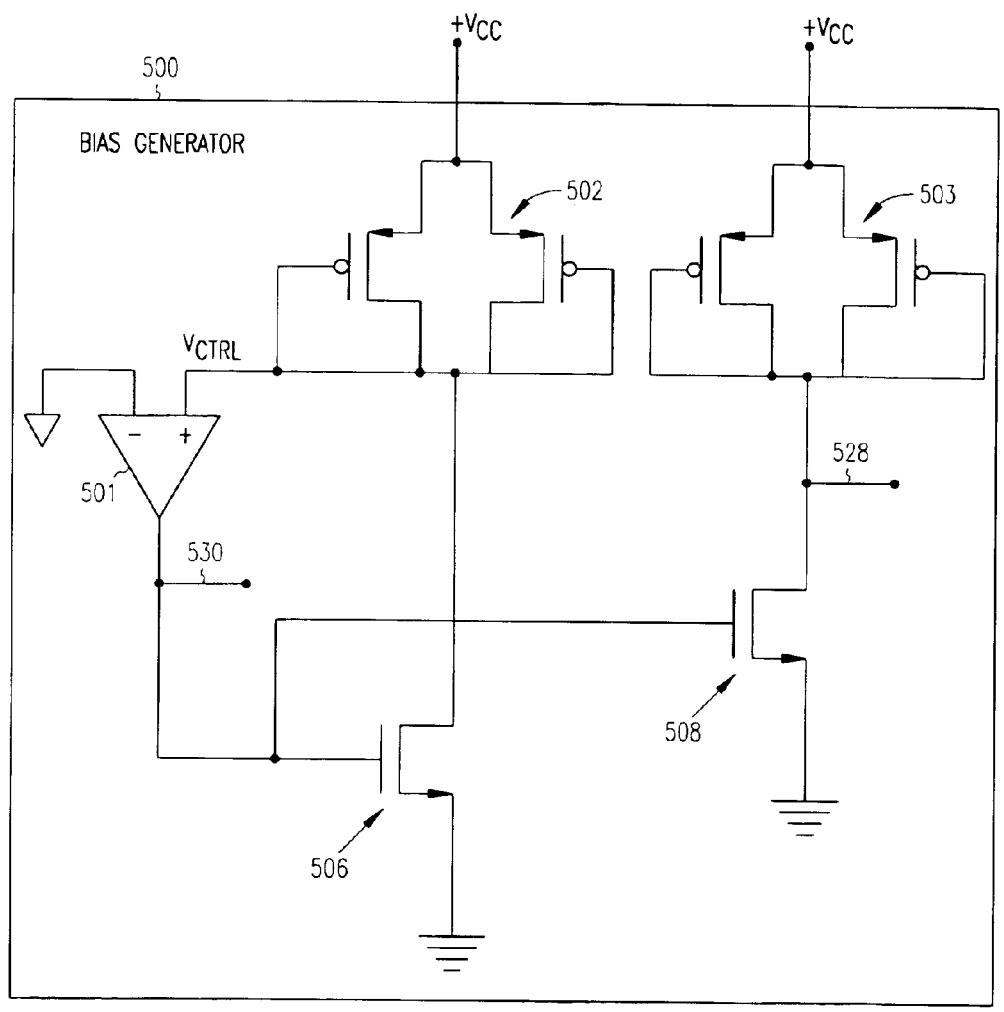
FIG. 5 is a circuit diagram of a bias generator in accordance with an embodiment of the present invention.

FIG. 5 is a circuit diagram of a bias generator in accordance with an embodiment of the present invention. Bias generator 500 may be suitable for use as bias generator 232 (FIG. 2) although other bias generators and bias-generating circuits may also be suitable. Bias generator 500 generates bias signals 528 and 530 which may correspond respectively to bias signals 228 and 230 (FIG. 2). Bias generator 500 may comprise operational amplifier 501 responsive to control signal 516. Control signal 516 may correspond to control signal 216 (FIG. 2). Bias generator 500 may also comprise load elements 502 and 503 and current sources 506 and 508. Operational amplifier 501 is coupled to the current sources to generate bias signal 530. In embodiments, bias signals 528 and 530 may have an inverse relation to control signal 516, and bias signal 530 may have a non-linear inverse (e.g., quadratic) relation to control signal 516.

Figure 6:
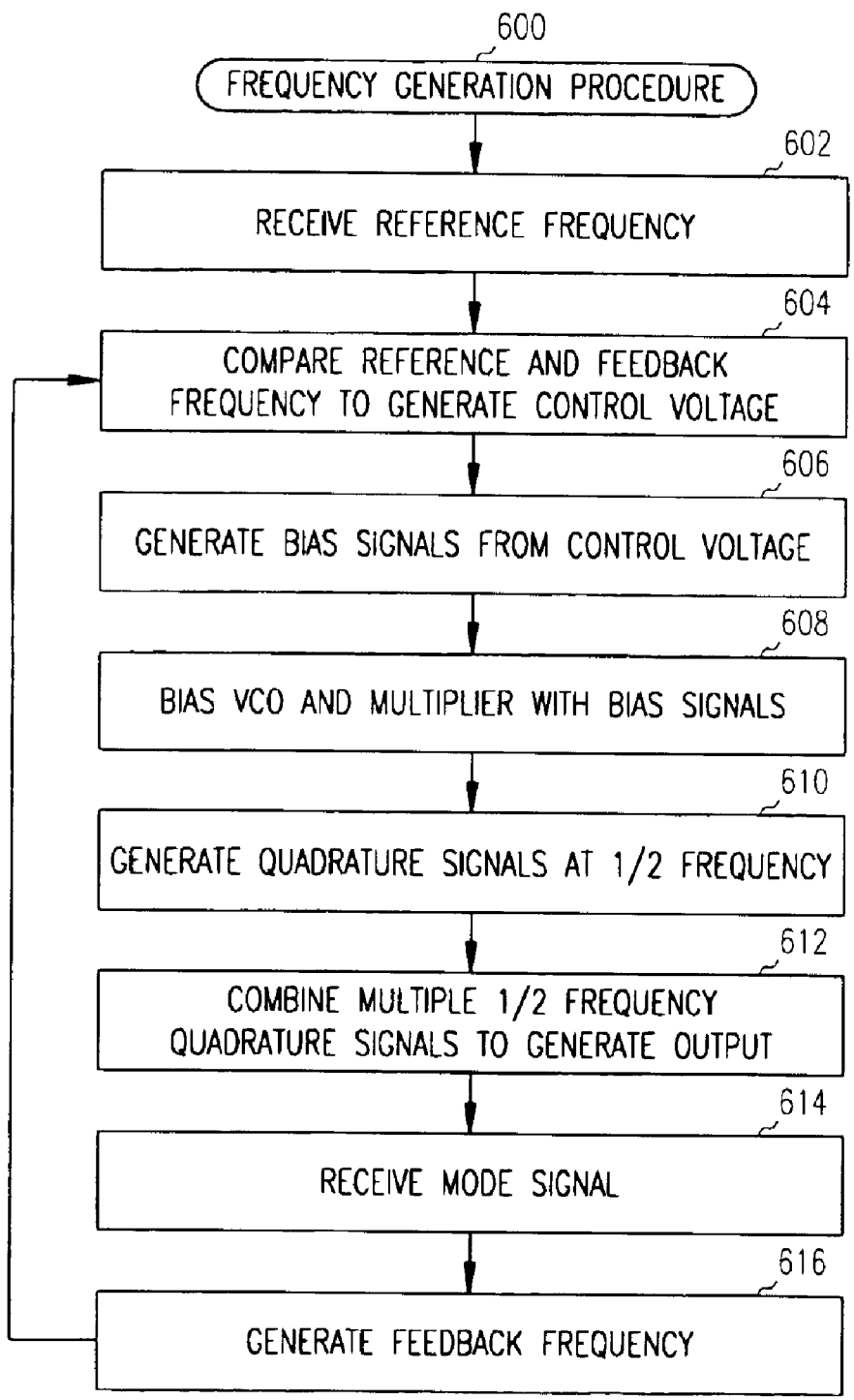
FIG. 6 is a flow chart of a frequency generation procedure in accordance with embodiments of the present invention.

FIG. 6 is a flow chart of a frequency generation procedure in accordance with embodiments of the present invention. Frequency generation procedure 600 may be performed by a phase-locked loop (PLL), such as PLL 200 (FIG. 2) although other devices may also perform procedure 600. In some embodiments, procedure 600 may be performed by a PLL as part of a wireless communication device, such as communication device 100 (FIG. 1), or as part of a processing or computing system. Procedure 600 may be used, among other things, for frequency synthesis, frequency multiplication, pulse synchronization, tone decoding, and AM and FM modulation and demodulation.

In operation 602, a reference frequency, such as reference frequency 204 (FIG. 2) is received. In operation 604, the reference frequency is compared with a feedback frequency, such as feedback frequency 206 (FIG. 2), to generate a control voltage, such as control voltage 216 (FIG. 2). Operation 604 may be performed by phase detector 202 (FIG. 2), charge pump 212 (FIG. 2) and loop filter 214 (FIG. 2) although other elements may also be suitable.

In operation 606, bias signals, such as bias signal 228 and 230 (FIG. 2), are generated from the control voltage. Bias generator 232 (FIG. 2) may be used to perform operation 606. In operation 608, a VCO and a multiplier are biased with the bias signals. In operation 608, a charge pump may also receive at least one of the bias signals.

In operation 610, quadrature signals at one-half an output frequency are generated. Operation 610 may be performed by a VCO, such as VCO 218 (FIG. 2), which may be biased with the bias signals generated in operation 606.

In operation 612, the quadrature signals generated in operation 610 are combined to generate an output signal at the output frequency. Operation 612 may be performed by a multiplier, such as multiplier 242 (FIG. 2), which may be biased by the bias signals. In some embodiments, the output signal may be divided in two to provide a 50% duty cycle signal, such as signal 226 (FIG. 2).

In operation 616, a feedback signal is generated for use in operation 604. In some embodiments, the feedback signal may be generated by dividing the frequency of the output signal by a whole number to provide the feedback signal. A frequency divider, such as frequency divider 222 (FIG. 2), may be used to generate the feedback signal.

In some embodiments, a mode signal may be received in operation 614. In these embodiments, the mode signal may control the frequency divider used in operation 616 in generating the feedback signal. The mode signal may indicate whether a communication device is in a standby node, a voice communication mode, a data communication mode, a video mode, or an audio mode. The receipt of a change in mode signal may cause the PLL to re-lock to a different output frequency and may allow different data rate communications.

Although the individual operations of procedure 600 are illustrated and described as separate operations, one or more of the individual operations may be performed concurrently, and nothing requires that the operations necessarily be performed in the order illustrated. Unless specifically stated otherwise, terms such as processing, computing, calculating, determining, displaying, or the like, may refer to an action and/or process of one or more processing or computing systems or similar devices that may manipulate and transform data represented as physical (e.g., electronic) quantities within a processing system's registers and memory into other data similarly represented as physical quantities within the processing system's registers or memories, or other such information storage, transmission or display devices. Furthermore, as used herein, computing device includes one or more processing elements coupled with computer-readable memory that may be volatile or non-volatile memory or a combination thereof.

Thus, a phase-locked loop and method of providing an output frequency have been described. A phase-locked loop and method that consume less power have also been described. A phase-locked loop and method that operate at lower bias currents have also been described. A phase-locked loop and method suitable for wireless communication devices have also been described.

The foregoing description of specific embodiments reveals the general nature of the invention sufficiently that others can, by applying current knowledge, readily modify and/or adapt it for various applications without departing from the generic concept. Therefore such adaptations and modifications are within the meaning and range of equivalents of the disclosed embodiments. The phraseology or terminology employed herein is for the purpose of description and not of limitation. Accordingly, embodiments of the invention embrace all such alternatives, modifications, equivalents and variations as fall within the spirit and scope of the appended claims.

It is emphasized that the Abstract is provided to comply with 37 C.F.R. section 1.72(b) requiring an abstract that will allow the reader to ascertain the nature and gist of the technical disclosure. It is submitted with the understanding that it will not be used to limit or interpret the scope or meaning of the claims.

What is claimed is:

1. A phase-locked loop comprising:
a voltage-controlled oscillator to generate a plurality of quadrature-phase signals at one-half an output frequency in response to bias signals; and
a multiplier biased by the bias signals to generate the output frequency from the quadrature-phase signals, wherein the bias signals change with the output frequency.

2. The phase-locked loop of claim 1 wherein the multiplier is a times-two multiplier to generate the output frequency, and
wherein the quadrature-phase signals comprise four signals at approximately one-half the output frequency and having approximately ninety-degree phase differences therebetween.

3. A phase-locked loop comprising:
a voltage-controlled oscillator to generate a plurality of quadrature-phase signals at one-half an output frequency in response to bias signals; and
a multiplier biased by the bias signals to generate the output frequency from the quadrature-phase signals, wherein the bias signals comprise:
a load-element bias signal to bias load elements of buffer stages of the voltage-controlled oscillator and to bias load elements of the multiplier; and
a current-source bias signal to bias current sources of the buffer stages of the voltage-controlled oscillator and to bias a buffer stage of the multiplier.

4. The phase-locked loop of claim 3 wherein the bias signals have an inverse relation to a control voltage, and wherein the load-element bias signal has a quadratic relation to the control voltage.

5. A phase-locked loop comprising:
a voltage-controlled oscillator to generate a plurality of quadrature-phase signals at one-half an output frequency in response to bias signals; and
a multiplier biased by the bias signals to generate the output frequency from the quadrature-phase signals, wherein the voltage-controlled oscillator comprises:
a ring oscillator having a plurality of buffer stages to generate the quadrature-phase signals, the buffer stages having load elements biased in accordance with a first of the bias signals;
a source-coupled differential pair; and
a current source for the source-coupled differential pair, the current source biased in accordance with a second of the bias signals.

6. The phase-locked loop of claim 5 wherein the multiplier comprises:
multiplier load elements biased in accordance with the first of the bias signals;
multiplier source-coupled differential pairs; and
a multiplier current source for the multiplier source-coupled differential pairs, the multiplier current source biased in accordance with the second of the bias signals.

7. The phase-locked loop of claim 6 wherein the load elements of the voltage-controlled oscillator and multiplier comprise substantially identical P-channel metal-oxide semiconductor transistor elements, and wherein the current sources of the voltage-controlled oscillator and multiplier comprise substantially identical N-channel metal-oxide semiconductor transistor elements.

8. The phase-locked loop of claim 7 wherein the P-channel metal-oxide semiconductor transistor elements and the load elements of the voltage-controlled oscillator and multiplier are located on a single die, and the N-channel metal-oxide semiconductor transistor elements of the voltage-controlled oscillator and multiplier are on the single die.

9. A phase-locked loop comprising:
a voltage-controlled oscillator to generate a plurality of quadrature-phase signals at one-half an output frequency in response to bias signals;
a multiplier biased by the bias signals to generate the output frequency from the quadrature-phase signals;
a loop filter to generate a control voltage; and
a bias generator to generate the bias signals in response to the control voltage, the bias signals having an inverse relation to the control voltage.

10. A phase-locked loop comprising:
a voltage-controlled oscillator to generate a plurality of quadrature-phase signals at one-half an output frequency in response to bias signals;
a multiplier biased by the bias signals to generate the output frequency from the quadrature-phase signals; and
a frequency divider to divide the output frequency by a whole number in response to a mode signal, the mode signal to change the output frequency of the phase-locked loop.

11. The phase-locked loop of claim 10 wherein the mode signal is provided by a baseband processor of a wireless communication device to indicate whether the device is in one of a standby node, a voice communication mode, a data communication mode, a video mode, or an audio mode, the receipt of a change in mode signal to cause the phase-locked loop to re-lock to a different output frequency.

12. A method to reduce power consumption in a phase-locked loop comprising:
   generating quadrature signals at approximately one-half an output frequency based on bias signals; and
   biasing a multiplier with the bias signals to multiply the quadrature signals by two to generate an output signal at the output frequency,
   wherein the bias signals change with the output frequency.

13. The method of claim 12 wherein generating quadrature signals is performed by a voltage-controlled oscillator and multiplying is performed by a times-two multiplier, and
   wherein the voltage-controlled oscillator when operating at one-half the output frequency together with the multiplier consume less power than the voltage-controlled oscillator when operating at the output frequency.

14. The method of claim 12 wherein generating the quadrature signals comprises generating a plurality of quadrature-phase signals having about a ninety-degree phase difference between adjacent signals.

15. A method to reduce power consumption in a phase-locked loop comprising:
   generating quadrature signals with a voltage-controlled oscillator at approximately one-half an output frequency;
   multiplying the quadrature signals by two with a times-two multiplier to generate an output signal at the output frequency;
   generating bias signals in response to a control voltage, the bias signals having an inverse relation to the control voltage;
   biasing the voltage-controlled oscillator with the bias signals to generate the quadrature signals; and
   biasing the multiplier with the bias signals to generate the output frequency,
   wherein the voltage-controlled oscillator when operating at one-half the output frequency together with the multiplier consume less power than the voltage-controlled oscillator when operating at the output frequency.

16. A method to reduce power consumption in a phase-locked loop comprising:
   generating quadrature signals with a voltage-controlled oscillator at approximately one-half an output frequency;
   multiplying the quadrature signals by two with a times-two multiplier to generate an output signal at the output frequency;
   generating a control voltage with a loop filter; and
   generating the bias signals in response to the control voltage, the bias signals having an inverse relation to the control voltage,
   wherein the voltage-controlled oscillator when operating at one-half the output frequency together with the multiplier consume less power than the voltage-controlled oscillator when operating at the output frequency.

17. A method to reduce power consumption in a phase-locked loop comprising:
   generating quadrature signals with a voltage-controlled oscillator at approximately one-half an output frequency;
   multiplying the quadrature signals by two with a times-two multiplier to generate an output signal at the output frequency;
   generating a load-element bias signal to bias load elements of buffer stages of the voltage-controlled oscillator and to concurrently bias load elements of the multiplier; and
   generating a current-source bias signal to bias current sources of the buffer stages of the voltage-controlled oscillator and to concurrently bias a buffer stage of the multiplier,
   wherein the voltage-controlled oscillator when operating at one-half the output frequency together with the multiplier consume less power than the voltage-controlled oscillator when operating at the output frequency.

18. A method to reduce power consumption in a phase-locked loop comprising:
   generating quadrature signals at approximately one-half an output frequency;
   multiplying the quadrature signals by two to generate an output signal at the output frequency;
   receiving a mode signal at a frequency divider to divide the output frequency by a whole number in response to the mode signal, the mode signal to change the output frequency of the phase-locked loop,
   wherein the mode signal is provided by a baseband processor of a wireless communication device to indicate whether the device is in one of a standby node, a voice communication mode, a data communication mode, a video mode, or an audio mode, the receipt of a change in the mode signal to cause the phase-locked loop to re-lock to a different output frequency.

19. The method of claim 18 further comprising:
   receiving a reference frequency from the baseband processor;
   aligning phases of the reference frequency and the output frequency to generate either an up or down pulse;
   charging or discharging a loop-filter capacitor in response to the up or down pulse; and
   varying the control voltage in response to the charging or discharging.

20. A wireless communication device comprising:
   an omnidirectional antenna to communicate radio frequency signals;
   a radio frequency conversion circuit to convert the radio frequency signals to baseband signals; and
   a baseband processor to process baseband signals, the baseband processor including a phase-locked loop to provide a clock signal for use in processing the baseband signals, the phase-locked loop comprising a voltage-controlled oscillator to generate a plurality of quadrature-phase signals at one-half an output frequency in response to bias signals, and a multiplier biased by the bias signals to generate the output frequency from the quadrature-phase signals,
   wherein the bias signals change with the output frequency.

21. A wireless communication device comprising:
   an omnidirectional antenna to communicate radio frequency signals;
   a radio frequency conversion circuit to convert the radio frequency signals to baseband signals; and a baseband processor to process baseband signals, the baseband processor including a phase-locked loop to provide a clock signal for use in processing the baseband signals, the phase-locked loop comprising a voltage-controlled oscillator to generate a plurality of quadrature-phase signals at one-half an output frequency in response to bias signals, and a multiplier biased by the bias signals to generate the output frequency from the quadrature-phase signals, wherein the phase-locked loop further comprises:

a loop filter to generate a control voltage; and a bias generator to generate the bias signals in response to the control voltage, the bias signals having an inverse relation to the control voltage, wherein the bias signals comprise:

a load-element bias signal to bias load elements of buffer stages of the voltage-controlled oscillator and to bias load elements of the multiplier; and a current-source bias signal to bias current sources of the buffer stages of the voltage-controlled oscillator and to bias a buffer stage of the multiplier.

22. A wireless communication device comprising:

an omnidirectional antenna to communicate radio frequency signals;

a radio frequency conversion circuit to convert the radio frequency signals to baseband signals; and a baseband processor to process baseband signals, the baseband processor including a phase-locked loop to provide a clock signal for use in processing the baseband signals, the phase-locked loop comprising a voltage-controlled oscillator to generate a plurality of quadrature-phase signals at one-half an output frequency in response to bias signals, and a multiplier biased by the bias signals to generate the output frequency from the quadrature-phase signals, wherein the phase-locked loop further comprises:

a frequency divider to divide the output frequency by a whole number in response to a mode signal generated by the baseband processor, the mode signal to change the output frequency of the phase-locked loop, the mode signal to indicate whether the device is in one of a standby node, a voice communication mode, a data communication mode, a video mode, or an audio mode, wherein the receipt of a change in the mode signal to cause the phase-locked loop to re-lock to a different output frequency allowing the device to operate at a different data rate.

* * * * *